(12) United States Patent
Garg et al.

(10) Patent No.: US 7,577,858 B2
(45) Date of Patent: Aug. 18, 2009

(54) METHOD FOR REDUCING POWER CONSUMPTION IN A STATE RETAINING CIRCUIT, STATE RETAINING CIRCUIT AND ELECTRONIC DEVICE

(75) Inventors: Manish Garg, Eindhoven (NL); Kiran Batni Raghavendra Rao, Eindhoven (NL); Jose De Jesus Pineda De Gyvez, Eindhoven (NL)

(73) Assignee: NXP B.V., Eindhoven (NL)

( * ) Notice: Subject to any disclaimer, the term of this patent is extended or adjusted under 35 U.S.C. 154(b) by 209 days.

(21) Appl. No.: 10/525,488

(22) PCT Filed: Aug. 4, 2003

(86) PCT No.: PCT/IB03/03418

§ 371 (c)(1),
(2), (4) Date: Feb. 23, 2005

(87) PCT Pub. No.: WO2004/021351

PCT Pub. Date: Mar. 11, 2004

(65) Prior Publication Data

US 2006/0119991 A1    Jun. 8, 2006

(30) Foreign Application Priority Data

Aug. 28, 2002  (EP) ................... 02078531
Oct. 11, 2002  (EP) ................... 02079217
Apr. 11, 2003  (EP) ................... 03100980

(51) Int. Cl.
*G06F 1/00* (2006.01)
*G06F 1/26* (2006.01)
*G06F 1/32* (2006.01)
*H03K 19/00* (2006.01)

(52) U.S. Cl. ................... 713/320; 713/300; 713/323; 713/324; 326/136

(58) Field of Classification Search ............ 713/320, 713/300, 323, 324; 326/136
See application file for complete search history.

(56) References Cited

U.S. PATENT DOCUMENTS 4,683,382 A * 7/1987 Sakurai et al. ............... 327/544

(Continued)

FOREIGN PATENT DOCUMENTS

WO    WO0150473 A2    7/2001

*Primary Examiner*—Ji H Bae

(57) ABSTRACT

A method for reducing the power consumption in a state retaining circuit during a standby mode is disclosed comprising, in an active state, providing a regular power supply (VDD) and a standby power supply (VDD STANDBY) to the state retaining circuit; for a transition from an active state to a standby state, decreasing the regular power supply to ground level and maintaining the standby power supply (VDD STANDBY) thus providing the circuit elements (36, 142, 78, 85) of the state retaining circuit with enough power for retaining the state during standby mode; and for a transition from the standby state to the active state, increasing the regular power supply (VDD) from its ground level to its active level. A circuit for reducing the power consumption in a state retaining circuit during a standby mode is disclosed comprising a control unit (1) providing at least one control signal; a data input unit (3) providing at least one input signal; a data output unit (7) providing at least one output signal; a data storage unit (5) for holding the state of the circuit during an a standby mode; a regular power supply supplying power to the data storage unit (5) during an active mode; and a standby power supply supplying power to at least a part of the data storage unit (5) during the active mode and the standby mode.

25 Claims, 7 Drawing Sheets

U.S. PATENT DOCUMENTS

| | | | |
|---|---|---|---|
| 5,204,963 A * | 4/1993 | Noya et al. ................. 365/229 |
| 5,463,588 A * | 10/1995 | Chonan ..................... 365/226 |
| 5,784,548 A * | 7/1998 | Liong et al. ..................... 714/6 |
| 5,812,463 A | 9/1998 | Park |
| 5,955,913 A | 9/1999 | Roohparvar |
| 5,986,962 A * | 11/1999 | Bertin et al. ................ 365/228 |
| 6,212,641 B1 * | 4/2001 | Frank et al. ................. 713/323 |
| 6,333,671 B1 * | 12/2001 | Roberts et al. ............. 327/544 |
| 6,337,583 B1 * | 1/2002 | Ooishi et al. ................ 326/119 |
| 6,344,761 B2 | 2/2002 | Nishimura et al. |
| 6,661,279 B2 * | 12/2003 | Yabe ......................... 327/546 |
| 6,762,638 B2 * | 7/2004 | Correale et al. ............. 327/202 |
| 6,787,938 B1 * | 9/2004 | McClure et al. ............ 307/125 |
| 7,127,228 B2 * | 10/2006 | Chang et al. ............. 455/343.1 |
| 2001/0038552 A1 | 11/2001 | Ishimaru |
| 2002/0024873 A1 | 2/2002 | Tomishima et al. |

* cited by examiner

METHOD FOR REDUCING POWER CONSUMPTION IN A STATE RETAINING CIRCUIT, STATE RETAINING CIRCUIT AND ELECTRONIC DEVICE The present invention relates to a method, circuit and electronic device for reducing power consumption, in particular to a method, state retaining circuit and electronic device for reducing power consumption in a state retaining circuit during a standby mode.

Leakage power is increasingly becoming a large drain on battery operated devices, especially in a state retaining circuit having a large standby time. One obvious way to avoid leakage is to shut down the supply during standby. However, many systems have to maintain their state during standby and by shutting supply voltage in e.g. digital circuits, wherein the state is defined by the data stored in the latches or state retaining circuits, the state is lost.

U.S. Pat. No. 5,812,463 provides a high speed, high voltage latch that reduces leakage current and vulnerability to latch-up. The latch has a switching transistor between a program power supply and the output. The switching transistor is turned off by the latch input when the latch input transitions so as drive the output to a low level. The switching transistor thereby reduces leakage current. An output driver transistor coupled to the program power supply is used. The latch output is initially pulled up through a Vcc power supply. The output driver transistor turns on after the latch output has been pulled up to an initial level. The output driver transistor then pulls up the output terminal to the high output voltage level through the program power supply. Pulling up the output initially with the Vcc power supply reduces the device power dissipation. The latch circuit further comprises two program power supplies to prevent latch-up, an n-well power supply and a local power supply. When the latch is switched from read mode to program mode the n-well power supply is raised to the program voltage before the local power supply is raised. When the latch is switched from program mode to read mode the n-well power supply voltage is not reduced until after the local power supply has been reduced and the rest of the circuit has discharged. This ensures the n-well voltage is at least as high as the voltage of the p-diffusions coupled to the n-well and thereby prevents latch-up. U.S. Pat. No. 5,812,463 is related to a memory circuit. As an embodiment a low leakage latch circuit is proposed. The disclosed circuit is applicable to certain type of memories like Flash or EEPROM. The proposed latch circuit is a level shifter which is used at the interface between normal and high voltage circuitry in flash memories.

U.S. Pat. No. 5,955,913 discloses an integrated circuit selectively operable in either a first mode (consuming low power) or a second mode (consuming relatively high power). The circuit includes MOS transistors and a supply voltage circuit for at least one of the transistors. In both modes, the supply voltage circuit holds the body of each transistor at a fixed voltage (e.g., a voltage Vcc in a range from 5 to 5.5 volts, where each transistor is a PMOS device). In the second mode the supply voltage circuit supplies this fixed voltage to the source of each transistor, but in the first mode it supplies a voltage equal to or slightly offset from the fixed voltage to the source of each transistor. In some embodiments, the supply voltage circuit (in the first mode, after an initial transient state) supplies a first voltage to a well shared by a plurality of PMOS transistors, and a second voltage to the source of each PMOS device. Alternatively, the supply voltage circuit (in the first mode, after an initial transient state) supplies a first voltage to the body of each of a plurality of NMOS transistors, and a second voltage to the source of each NMOS device. The second voltage is preferably offset from the first voltage by a voltage drop chosen to achieve a desired decrease in transistor leakage current in the first mode and a desired power up time for a transition from the first mode to the second mode. In preferred embodiments, the integrated circuit is a memory chip including a flash memory array, the voltage drop is in the range from 1.4 volts to 2 volts, and the voltage drop is implemented with one diode-connected MOS transistor or two diode-connected MOS transistors connected in series.

US 2001/0038552 A1 discloses a semiconductor memory with static memory cells having an n-well in which PMOS transistors are formed and a p-well in which NMOS transistors are formed. The n- and p-wells are divided into blocks each containing a given number of memory cells. The n- and p-wells in each block receive voltages that vary depending on whether or not the memory cells are selected. If the memory cells are selected to operate, the threshold voltage of each transistor in the memory cells is decreased to increase current to be taken out of the memory cells. If the memory cells are not selected, the threshold voltage is increased to reduce leakage current of the memory cells. This arrangement suppresses standby current and improves the operation speed of the memory cells.

U.S. Pat. No. 5,955,913 and US 2001/0038552 propose the classical idea of reducing leakage by electrically increasing the threshold voltage of the MOS switch using back-bias voltage. They give respective memory circuits as embodiments.

U.S. Pat. No. 6,344,761 B2 discloses that in a current comparison type latch, during a reset mode of the current comparison type latch where the clock signal is at the "L" level, transistors which are disposed along the current path extending from the high potential power supply line to the low potential power supply line are turned OFF while transistors which connect the high potential power supply line to two output terminals are turned ON, so as to bring the potential of each of the two output terminals to a logic level (the "H" level or the "L" level), thereby preventing a through current from flowing from the high potential power supply line to the low potential power supply line. Therefore, a high-speed and high-precision current comparison is made while reducing the through current during a reset mode. U.S. Pat. No. 6,334, 761 B2 describes a current comparison type latch for use in an analog-digital converter and the like. The object is to provide a current comparison type latch which eliminates the through current flowing in a reset state so as to achieve a reduction in the power consumption, and which is capable of making a high-speed and high-precision comparison.

US 2002/0024873 A1 discloses a level converter converting a word line group specifying signal, which is sent from a row decoder and has amplitude of a power supply potential Vcc and a ground potential GND, into mutually complementary logic signals WD and ZWD of a high voltage Vpp and a negative potential Vbb. An RX decoder decodes an address signal to output a signal of an amplitude of (Vpp-Vbb) specifying a word line in a word line group. A word driver provided corresponding to each word line transmits a word line specifying signal or a negative potential to the corresponding word line in accordance with signals WD and ZWD sent from a level converting circuit. The non-selected word line receives negative potential Vbb from a word driver. The selected word line receives high voltage Vpp from the word driver. It is possible to suppress a channel leak current at a memory transistor in the non-selected memory cell, which may be caused by the potential change of the word line and/or bit line, and a charge holding characteristic of the memory cell can be improved. US 2002/0024873 discloses a dynamic semiconductor memory device storing information in the form of electrical charges. This memory comprises a structure for improving charge retention characteristics of memory cells.

U.S. Pat. No. 6,344,761 and US 20020024873 relate to semiconductor memory devices with reduced leakage current and include the following features. When the low potential power source is switched off, transistors connected to a high potential source are switched on, preventing a through current. A separate power source is provided for NMOS devices.

It is an object of the present invention to provide a method, a state retaining circuit and an electronic device having improved power consumption characteristics during a standby mode.

To achieve the object of the present invention a method for reducing the power consumption in a state retaining circuit, e.g., a latch, flipflop or other data storage element, during a standby mode is disclosed comprising, in an active state, providing a regular power supply VDD and a standby power supply VDD_STANDBY to the state retaining circuit; for a transition from an active state to a standby state, decreasing the regular power supply to ground level and maintaining the standby power supply VDD_STANDBY thus providing the circuit elements with enough power for retaining the state during standby mode; and for a transition from the standby state to the active state, increasing the regular power supply VDD from its ground level to its active level. The method allows to shut the regular supply to the digital circuits without losing the state of the circuit, thereby significantly reducing leakage, e.g., by a factor of about 100 in CMOS12 technology.

According to a preferred embodiment of the invention, the standby power supply VDD_STANDBY is decreased to a lower level which is enough for retaining the state of the circuit elements in moving from an active state to a standby state; and the standby power supply VDD_STANDBY is increased from its lower voltage to its active level in returning back into the active mode. The decreasing of the standby power supply VDD_STANDBY to a lower level reduces leakage power in a standby mode.

According to a preferred embodiment of the invention, retaining of the state of the circuit elements during standby mode is done by transistors with high threshold voltages. The use of transistors with high threshold voltage leads to a very small leakage power.

According to a preferred embodiment of the invention, a control signal is held during standby mode.

According to a preferred embodiment of the invention, the control signal is held at a predetermined >low= level during standby mode, by means which may be external to the state retaining circuit. However, in a more preferred embodiment of the invention, the control signal is held during standby mode by means provided within the state retaining circuit. Such means may comprise at least one transistor having a gate terminal connected to a standby signal, and arrange to be switched >on= during standby mode and >off= otherwise, the drain or source terminal of the transistor being connected to a line having a voltage level at which the control signal is required to be held. That voltage level may be substantially ground. In one embodiment of the invention, the transistor may be an n-channel MOSFET, having a gate terminal connected to a standby signal which is >high= during standby mode and >low= otherwise, and a source terminal connected to ground.

A further object of the present invention is achieved by a state retaining circuit, comprising a control unit for providing at least one control signal; a data input unit for providing at least one input signal; a data output unit for providing at least one output signal; a data storage unit comprising circuit elements for holding at least a part of the state of the circuit during a standby mode; first means for coupling a power supply from a regular power supply to the circuit elements during an active mode; and second means for coupling a power supply from a standby power supply to the circuit elements during the active mode and the standby mode. In comparison to known low-power circuits, the state retaining circuit of the present invention is capable of significantly reducing the power consumption in a standby mode of a circuit or electronic device in which the state retaining circuit is integrated.

According to a preferred embodiment of the invention, the control unit is connected to the regular power supply and to the standby power supply. The control signal is maintained during a standby mode because of the connection of the control unit to the standby power supply.

According to a preferred embodiment of the invention, the control unit comprises at least one input terminal receiving a control input signal and at least one control output terminal. The control unit is able to deal with at least one control input signal and is able to put out at least one output control signal. This is advantageous because different input control signals can be used. The different output terminals can be connected to different circuit elements with different control signals.

According to a preferred embodiment of the invention, the control unit comprises at least one state retaining switch for retaining the state during a standby mode. It is an advantageous feature of the control unit that every control unit comprises at least one state retaining switch for retaining the state during a standby mode because the state is retained directly at the source of the control signal.

Preferably, the control unit comprises at least two inverter stages providing at least one inverted control signal and at least one not inverted control signal.

Preferably, the control unit is arranged to retain the state of the inverted control signal and/or the non-inverted control signal during a standby mode. To this end, the control unit is coupled to the standby voltage supply. The control unit may comprise high threshold voltage transistors to reduce the leakage current from the control unit during standby.

According to another preferred embodiment of the invention, the data storage unit is connected to the regular power supply and to the standby power supply. Preferably, the data storage unit is connected to the inverted control signal and to the not inverted control signal.

According to another preferred embodiment of the invention, the data storage unit comprises at least one state retaining switch retaining the inverted data input signal and/or at least one state retaining switch retaining the not inverted data input signal.

According to a further preferred embodiment of the invention, the data storage unit comprises a serial circuit for retaining the inverted data input signal.

Preferably, the serial circuit for retaining the inverted data input signal comprises a state retaining switch retaining the inverted data input signal connected to the standby power supply and a state retaining switch connected to the control signal.

Preferably, the data storage unit comprises high threshold voltage transistors for reducing the leakage current during standby.

According to another preferred embodiment of the invention, the state retaining switch in the data storage unit is a transistor with a high threshold voltage. The advantage of a transistor with a high threshold voltage is that the leakage power is very small.

According to one embodiment of the invention, means may be provided for holding the control signal at a predetermined level during standby. Such means may be included in the control unit, and may be connected to a standby signal which is >high= during standby mode and >low= otherwise. In any event, the circuit may include means for providing additional current to the circuit during active mode, so as to reduce the current requirement from the standby power supply.

Yet another object of the invention is realized by an electronic device, comprising a regular power supply; a standby power supply; a first circuit portion coupled to the regular power supply; and a second circuit portion coupled to the regular power supply and the standby power supply, the second circuit portion comprising a state retaining circuit for retaining a state of the first circuit portion during a standby mode of the electronic device, the state retaining circuit comprising: a control unit for providing at least one control signal; a data input unit for providing at least one input signal; a data output unit for providing at least one output signal; a data storage unit comprising circuit elements for holding at least a part of the state of the first circuit portion during the standby mode; the regular power supply being arranged to supply power to the circuit elements during an active mode of the electronic device; the standby power supply being arranged to supply power to the circuit elements during the active mode and the standby mode. In such an electronic device, a standby mode can be entered that allows for a power consumption reduction in both the first circuit portion and the second circuit portion. The first circuit portion may be completely switched off while only the state retaining circuit of the second circuit portion remains connected to a standby voltage supply. This way, a significant reduction of power consumption by the electronic device during its standby mode, which may involve switching off the complete electronic device or some parts of it, is achieved. Advantageously, the standby power supply is arranged to provide a reduced power to the circuit elements during the standby mode. This reduces the power consumption of the electronic device during its standby mode even further.

In a preferred embodiment of the electronic device, the circuit elements are located in a separate well of the second circuit portion. This has the advantage that the circuit elements that are located in this separate well, e.g., nMOS transistors in a p-well, pMOS transistors in an n-well or circuit elements realized other types of multiple well technologies, can be electrically separated from other parts of the electronic device, which means measures may be taken to further reduce power leakage from these other parts, e.g., backbiasing techniques, without interfering with the data stored in the circuit elements.

These and various other advantages and features of novelty which characterize the present invention are pointed out with particularity in the claims annexed hereto and forming a part hereof. However, for a better understanding of the invention, its advantages, and the object obtained by its use, reference should be made to the drawing which forms a further part hereof, and to the accompanying descriptive matter in which there is illustrated and described a preferred embodiment of the present invention.

Figure 1:
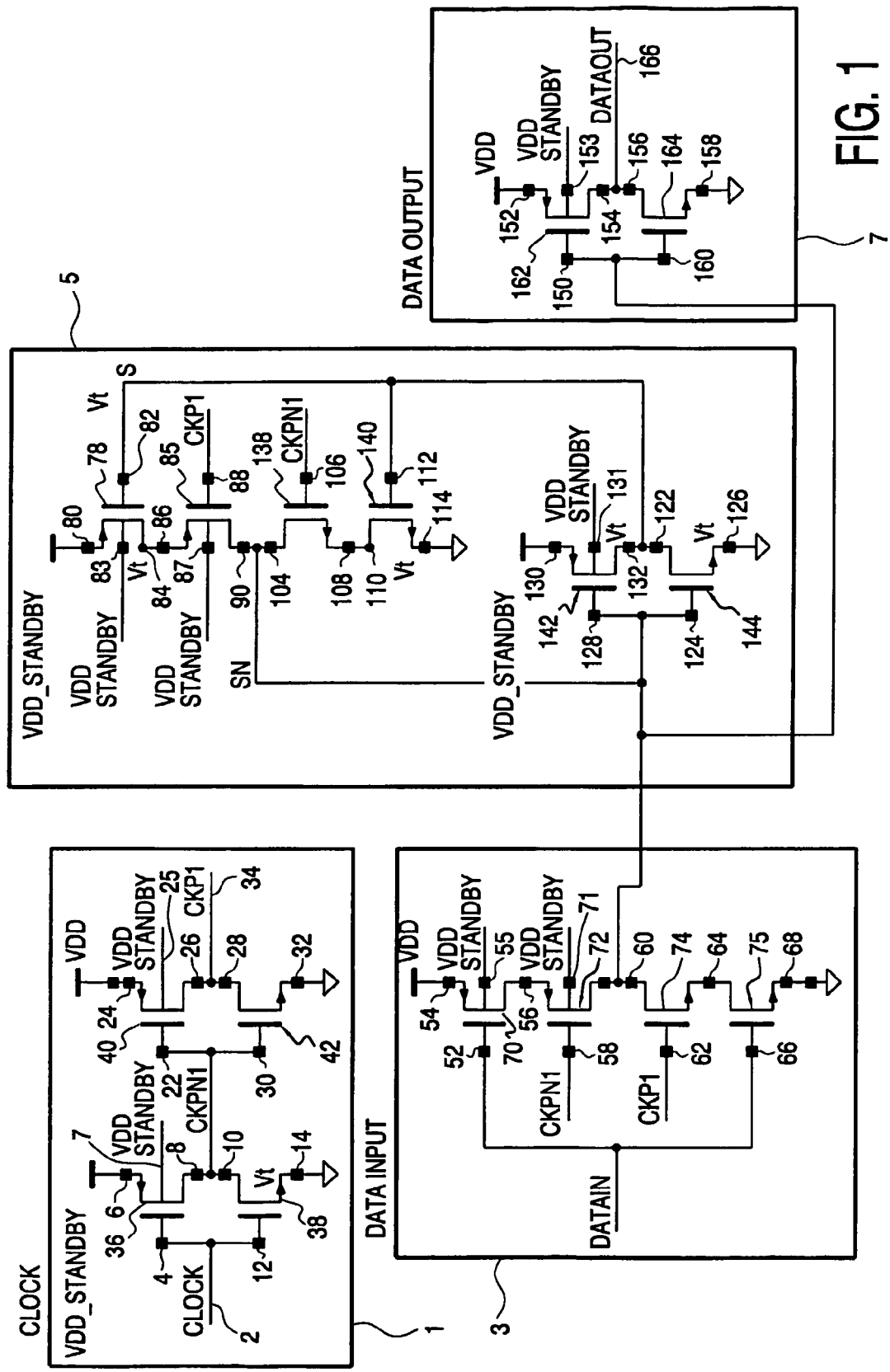
FIG. 1 shows an exemplary schematic circuit diagram of a state retaining circuit according to the FIG. 6 is a schematic diagram illustrating a suggested layout for standard cells.

The state retaining circuit diagram of FIG. 1 comprises FETs with a p-channel and an n-channel. A FET with a p-channel is on when the voltage between the gate and the source terminal is smaller than zero and is off when the voltage between the gate terminal and the source terminal is greater than zero. A FET with an n-channel is on when the voltage between the gate terminal and the source terminal is greater than zero and is off when the voltage between the gate and source terminals is smaller than zero.

The state retaining circuit diagram shows a control unit 1 comprising an input terminal 2 connected to a gate contact 4 of a transistor 36 and to a gate contact 12 of a transistor 38. The transistor 36 is a FET with a p-channel and transistor 38 is a FET with an n-channel. A source terminal 6 and a base terminal 7 of transistor 36 are connected to a standby power supply VDD_STANDBY. A drain terminal 8 of transistor 36 is connected to a drain terminal 10 of transistor 38. A source terminal 14 of transistor 38 is connected to ground. Transistor 38 is a transistor with a high threshold voltage. This is shown by the two letters Vt.

All other transistors, which are transistors with a high threshold voltage, are marked with the same letters. The transistors 36 and 38 form an inverter stage. An inverted control signal CKPNI of terminal 2 is output at the drain terminals 8 and 10. Transistor 36 retains the inverted control signal CKPNI during the standby mode. The drain terminals 8 and 10 are connected to a gate contact 22 of a p-channel transistor 40 and to a gate contact 30 of an n-channel transistor 42. A source terminal 24 of transistor 40 is connected to the regular power supply VDD and a base terminal 25 is connected to VDD_STANDBY. A drain terminal 26 of transistor 40 is connected to a drain terminal 28 of transistor 42. A source terminal 32 of transistor 42 is connected to ground. It is emphasized that the control signal and the inverted control signal typically are clock signals in synchronous, i.e., clocked, circuits, but that other control signals, e.g., handshake signals used in asynchronous circuits may be equally acceptable.

The two transistors 40 and 42 form another inverter stage. This inverter stage inverts the inverted control signal CKPNI into the not inverted control signal CKPI. The not inverted control signal CKPI is provided at terminal 34. Terminal 34 is connected to the drain terminals 26 and 28.

FIG. 1 also shows a data input unit 3 of the state retaining circuit. The data input unit 3 comprises an input terminal 50 connected to a gate contact 52 of a p-channel transistor 70 and to a gate contact 66 of an n-channel transistor 75. A source terminal 54 of transistor 70 is connected to the regular power supply VDD. A base terminal 55 of transistor 70 is connected to VDD_STANDBY. A drain terminal 56 of transistor 70 is connected to a source terminal of a p-channel transistor 72 at node 56. A gate terminal 58 of transistor 72 is connected to the inverted control signal CKPNI. A base terminal 71 of transistor 72 is connected to VDD_STANDBY. A drain contact of transistor 72 is connected to a drain contact of an n-channel transistor 74 at node 60. A gate terminal 62 of transistor 74 is connected to the not inverted control signal CKPI. A source terminal of transistor 74 is connected to a drain terminal of an n-channel transistor 75 at node 64. A source terminal of transistor 75 is connected to ground at node 68. The input signal is supplied to a data storage unit at node 60.

The data storage unit 5 comprises a p-channel transistor 142 connected at its gate 128 to node 60. A source terminal 130 of transistor 142 is connected to the VDD_STANDBY. A drain terminal 132 of transistor 142 is connected to a drain terminal 122 of an n-channel transistor 144. A gate terminal 124 of transistor 144 is also connected to the node 60. A source terminal 126 is connected to ground. The transistors 142 and 144 form an inverter stage. As mentioned before, the transistors 142 and 144 are marked with the letters Vt, and are therefore transistors with a high threshold voltage. Transistor 142 retains an input signal in case of a standby mode. The drain contacts 132 and 122 represent the output of the inverter stage formed by the two transistors 142 and 144.

A signal S supplied at the drain terminals 132 and 122 represents the data input signal of terminal 50. The signal S is connected to a gate terminal 82 of a p-channel transistor 78. Transistor 78 is a transistor with a high threshold voltage. A base terminal 83 of transistor 78 is connected to VDD_STANDBY. A gate terminal 88 of a p-channel transistor 85 is connected to the not inverted control signal CKPI. A base terminal 87 of transistor 85 is connected to VDD_STANDBY. A source terminal 80 of transistor 78 is connected to the standby power supply VDD_STANDBY. A drain contact 84 of transistor 78 is connected to a source terminal 86 of transistor 85. A gate terminal 106 of transistor 138 is connected to the inverted control signal CKPNI. A drain terminal 104 of transistor 138 is connected to terminal 90 of transistor 85. A source terminal 108 of transistor 138 is connected to a drain terminal 110 of an n-channel transistor 140. A source tenninal 114 of transistor 140 is connected to ground. A gate terminal 112 of transistor 140 is connected to the signal S. Transistor 140 is a transistor with a high threshold voltage.

An inverted signal SN is provided at the drain terminal 90. This inverted signal SN is supplied to a data output unit 7. The data output unit 7 receives the inverted signal SN at a gate terminal 150 of p-channel transistor 162 and at a gate terminal 160 of an n-channel transistor 164. A source terminal 152 of transistor 162 is connected to the regular power supply VDD. A base terminal 153 of transistor 162 is connected to VDD_STANDBY. A drain terminal 154 of transistor 162 is connected to a drain terminal 156 of transistor 164 and to a data output terminal 166. A source terminal 158 of transistor 164 is connected to ground. The transistors 162 and 164 form an inverter stage.

The present circuit comprises latches, the states of which latches need to be retained during standby—called state holding latches-, and combinatorial logic, latches etc. whose states need not be retained. Two supplies are used: one is the regular supply (VDD) and the other one is a standby supply (VDD_STANDBY). VDD is supplied to circuits the state of which is not retained whereas state holding latches are supplied with both the VDD and VDD_STANDBY. During active operation, both supplies are on.

To go into standby, the VDD is reduced to ground level and VDD_STANDBY is reduced to a lower voltage, which is just enough to keep the state in the state holding latches. Thus except for state holding latches, there is no standby leakage. The standby supply VDD_STANDBY provides the necessary current to maintain the state in the state holding latches. As very small current is drawn from VDD_STANDBY during the active and standby mode, routing requirements of VDD_STANDBY are relaxed.

The operation of the circuit of FIG. 1 may be as follows. First, consider active mode, where both VDD and VDD_STANDBY are on. If the CLOCK is high, DATAIN determines the states of nodes S and SN. When CLOCK goes low, the feedback loop in the state holding latch is complete, and the previous states of nodes S and SN is maintained. Now to move into standby, the normal supply VDD is lowered to ground level and then VDD_STANDBY is reduced to a lower level (just enough to maintain the state). As VDD is lowered, the control signal, e.g., CLOCK remains at ground level and the switches 36-85 maintain the states of nodes S, SN, CKPNI and CKPI.

The voltage of the rest of the nodes reach ground level and they become floating. Thus during standby, there is only a small leakage due to switches getting VDD_STANDBY. This small leakage is further reduced by making these switches high Vt as shown in FIG. 1. Now to return back into active mode, VDD_STANDBY is raised to its active level, and then VDD is raised from the ground level back to its active level. The state of the control signal, e.g., CLOCK is held during standby by outside circuitry and thus CLOCK remains low. The topology of the circuit is such that the states of nodes CKPNI, CKPI, S, and SN are maintained. The circuit can now begin its active operation.

All the P-switches in the latch are placed in an N-well, which is connected to supply VDD_STANDBY. This avoids the source/drain junctions of PMOS transistors getting forward biased during standby mode.

The invention allows to shut down the regular supply to the digital circuits without losing the state of the circuit, thereby reducing leakage by a significant factor, e.g., a factor of approximately 100 in CMOS12 technology. The state holding latch uses high Vt switches, and therefore its leakage is very small. In a digital circuit that uses this scheme, the logic gates can be optimized for speed by using low Vt switches without the cost of high standby leakage as the supply for the logic can be turned off during standby. Thus, this scheme offers high-performance and low leakage.

As stated above, as VDD is lowered the control signal, for example, CLOCK is caused to remain at ground level. However, it will be appreciated that, particularly when the circuit of FIG. 1 is used inside a larger design, during standby mode, the external inputs of the control unit 1 will be floating. If left floating the external control (or CLOCK) signal may charge up to higher voltages due to cross-talk or leakage effects, resulting in a large power dissipation in the control unit 1 of the circuit.

One way to overcome this problem would be to provide external means to hold the control signal (or CLOCK) at a low level. Alternatively, and more preferably, means may be provided within the control circuit 1 to firmly keep the >control= signal at a low level during standby.

Figure 2:
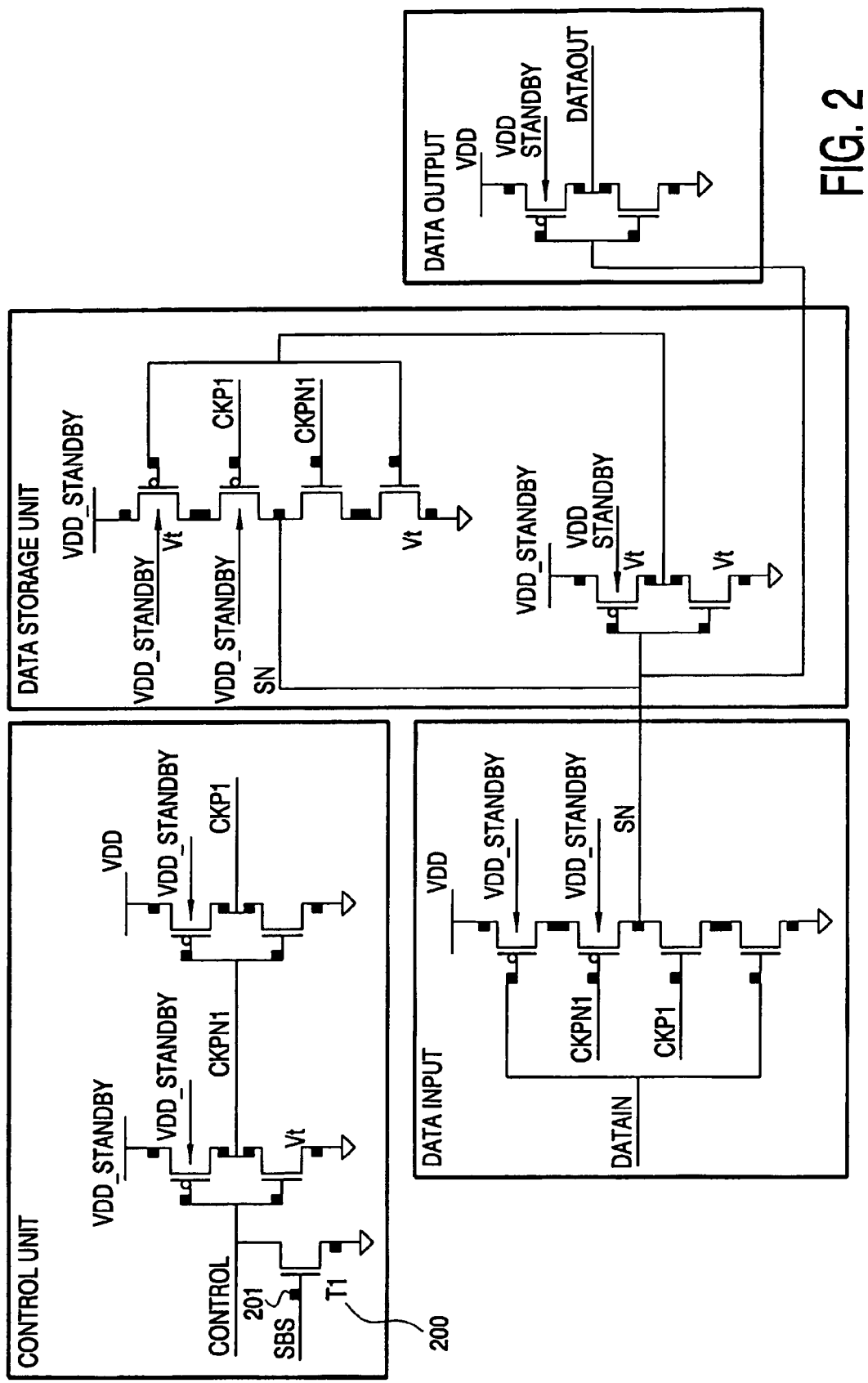
FIG. 2 shows an exemplary schematic circuit diagram of a state retaining circuit according to another embodiment of the present invention.

Referring to FIG. 2 of the drawings, such means may comprise an n-channel transistor 200 with its gate terminal 201 connected to an additional signal SBS. The signal SBS is a standby signal which is >high= during the standby mode and is >low= during the active mode of operation. Thus, in the standby mode, transistor 200 is switched >on= and, as a result, it holds the >control= signal at a low level. In the active mode, because the standby signal SBS is low, so transistor 200 is off and has no effect on the circuit operation. Thus, in the embodiment illustrated in FIG. 2 of the drawings, it is not necessary for the >control= signal to be externally held at a >low= level, to avoid the above-mentioned power loss.

Figure 3:
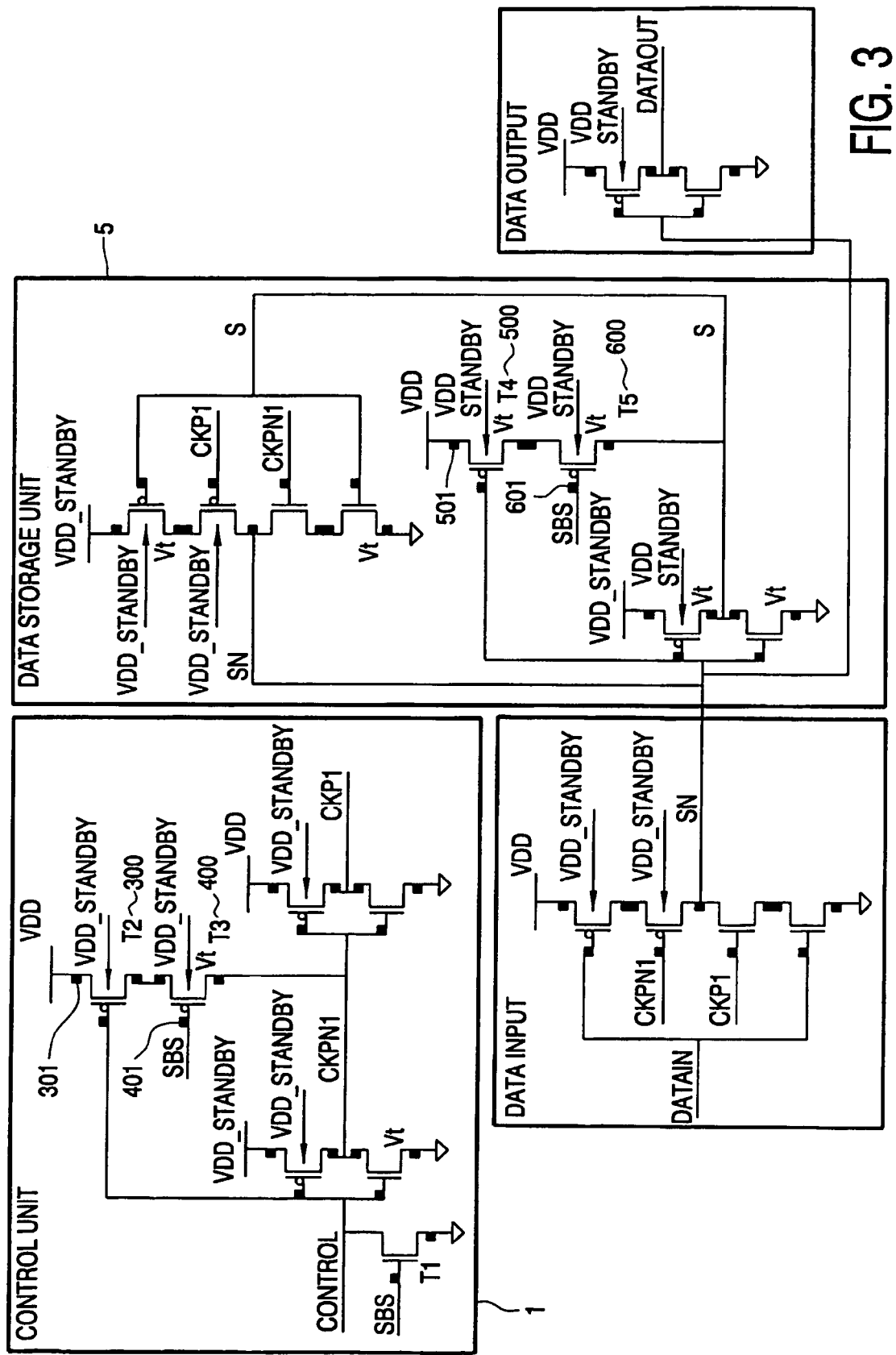
FIG. 3 shows an exemplary schematic circuit diagram of a state retaining circuit according to yet another embodiment of the present invention.

Referring to FIG. 3 of the drawings, another exemplary embodiment of the invention is similar in many respects to that of FIG. 2. However, in this case, four additional p.channel transistors 300, 400, 500 and 600 are included. Two of these additional transistors 300, 400 are provided in the control unit 1 and the other two additional transistors 500, 600 are provided in the data storage unit 5. The gate terminals 401, 601 of the transistors 400, 600 respectively are connected to the standby signal SBS (which is >high= during standby mode and >low= during active mode), so the p-channel transistors 400, 600 are >on= during active mode and >off= during the standby mode. The source terminals 301, 501 of the transistors 300, 500 respectively are connected to the regular supply >VDD=.

Thus, during the active mode, the path through transistors 300-400 and 500-600 can provide current to charge node CKPNI and S respectively. This has the effect of reducing the current requirement from the standby power supply >VDD_STANDBY= during the active mode. In fact, with transistors 300-600, all of the active power of the circuit is provided by the regular power supply >VDD=, and the standby power supply >VDD_STANDBY= needs to provide only the leakage power during the standby mode. Thus, in the presence of transistor 300-500, the >VDD_STANDBY= can be routed like a normal signal which reduces the routing area of the overall design. In the standby mode, transistors 400 and 600 are turned off and have no influence on circuit operation.

It will be appreciated that, although the additional features of the circuits of FIGS. 2 and 3 respectively can provide significant advantages over the circuit of FIG. 1, circumstances are envisaged in which these additional features may not be necessary. For example, in a design where the standby supply >VDD_STANDBY= can provide the necessary active current, the addition of transistors 300-600 (FIG. 3) may not be necessary. Similarly, if means are provided in the arrangements of FIG. 2 or FIG. 3 for externally keeping the >control= signal at a >low= level during standby, then the inclusion of transistor 200 (FIG. 2) can be avoided.

Figure 4:
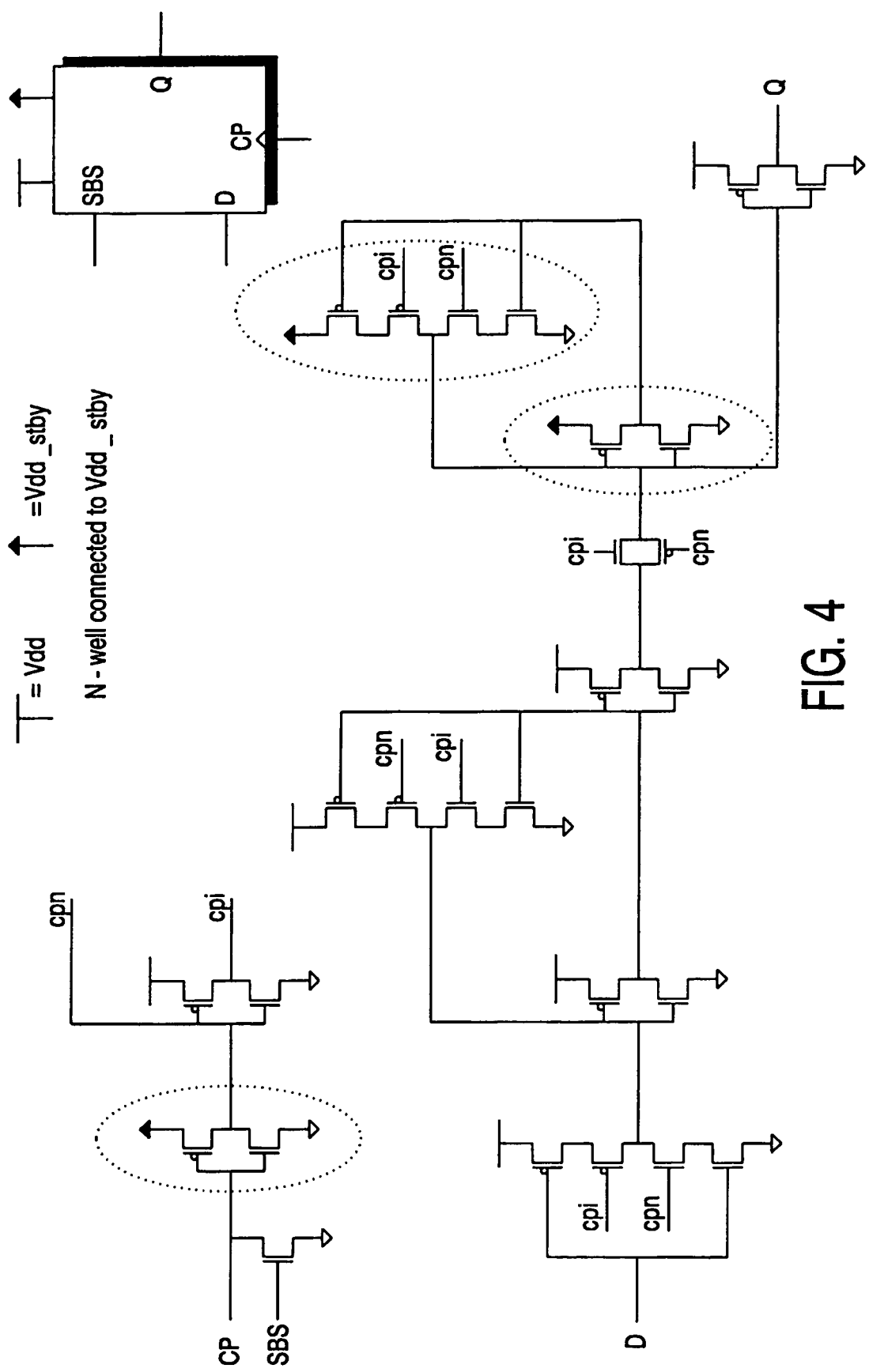
FIG. 4 shows an exemplary schematic circuit diagram of a state retaining circuit, having a functionality substantially similar to that of FIG. 2.
Figure 5:
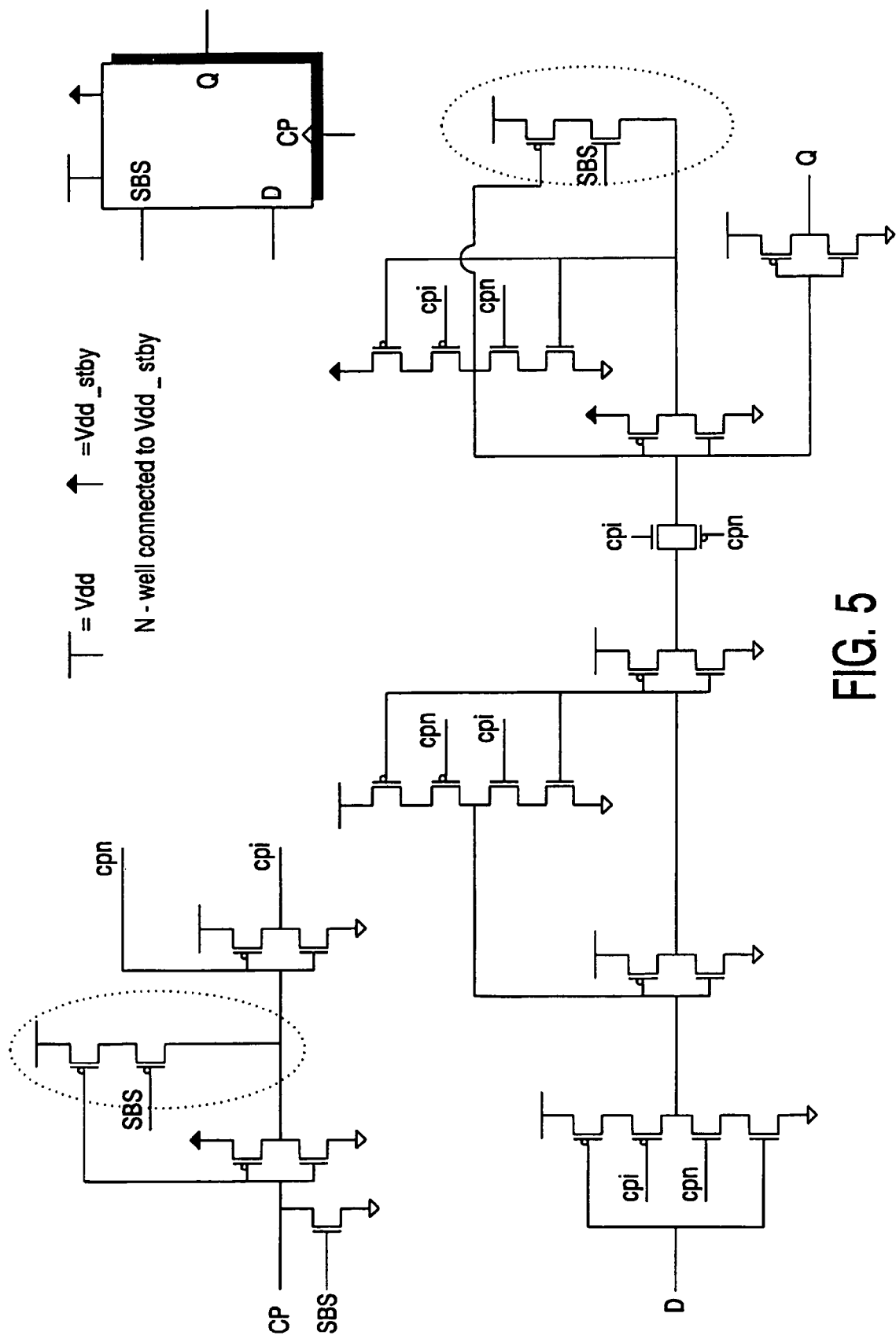
FIG. 5 shows an exemplary schematic circuit diagram of a state retaining circuit having a functionality substantially similar to that of FIG. 3.

FIGS. 4 and 5 of the drawings illustrate two further exemplary embodiments of the invention in the form of low power dual-supply flip-flop (DSF) circuits, in which simulation results carried out for 90 nm CMOS technology show a reduction in standby leakage (over conventional arrangements) by up to 10 times, with negligible impact on power and performance of the circuits in the active mode.

In both FIGS. 4 and 5, D denotes the data pin (>DATAIN= in FIGS. 1 to 3, CP is the clock pin (>CLOCK= in FIG. 1 and >CONTROL= in FIG. 2 and 3), Q is the output pin (>DATAOUT= in FIGS. 1 to 3), and SBS is the standby signal pin, as before.

It will be appreciated by a person skilled in the art that FIG. 4 illustrates an embodiment which has a slightly different configuration, but is effectively equivalent to the embodiment illustrated in FIG. 2. In both cases, all of the PMOS transistors are in the same n-well which is connected to VDD_STANDBY, since that will always remain the highest potential in the flip-flop (even when VDD is reduced to a very low voltage in standby). These transistors in the flip-flop which need not be powered during standby are connected to VDD, whereas these which absolutely need power in order to retain the state are connected to VDD_STANDBY (these are circled in FIG. 4). As shown, the back-to-back connected inverter configuration in the slave latch must necessarily be powered by VDD_STANDBY, since that is where the state is retained. The first inverter after the CP pin must also be powered by VDD_STANDBY, since the cpi (CKPI) and cpn (CKPNI) signals are held low and high respectively, in order that the back-to-back connected slave latch inverters hold the state. The rest of the flip-flop is powered by VDD.

The SBS pin must be held low during active mode, to ensure that the clock signal arriving at CP is not interrupted. However, in standby mode, it must be held high in order that CP is effectively pulled to a low value, thereby increasing the robustness of the flip-flop and ensuring a low value on cpn and a high value on cpi. (Note that it is not required that the output Q have any meaningful value in standby, since there is no gate observing it).

FIG. 5 is similar to FIG. 4, but has four additional transistors 300, 400, 500, 600 (circled). Although the configuration is slightly different, it is effectively equivalent to that of FIG. 3, and as such, the four additional transistors 300, 400, 500, 600 are connected and configured to greatly reduce the current drawn from VDD_STANDBY in the active mode when SBS=O.

Table 1 (below) shows the truth table for the dual supply flip-flop circuits of both FIGS. 4 and 5.

TABLE 1

DSFF truth table

| D | CP | SBS | Vdd | Vdd-stby | Q | mode |
|---|----|-----|-----|----------|---|------|
| 0 | r  | 0   | 1   | 1        | 0 | active |
| 1 | r  | 0   | 1   | 1        | 1 | active |
| x | f  | 0   | 1   | 1        | Q(old) | active |
| x | 0  | 0   | 1   | 1        | Q(old) | active |
| x | 1  | 0   | 1   | 1        | Q(old) | active |
| z | z  | 1   | 0   | 1        | z | standby |

The first two rows of the table show the case when there is a rising edge on CP. The next three rows show the cases CP=falling edge, 0 and 1 respectively, during which the output Q is held at the old value irrespective of D. Note that SBS and Vdd change only in the last row, which is the standby mode. During this mode, D, CP and Q go to a high impedance state because their drivers are not powered. However, the state is safely preserved inside DSF. SBS is held high, signifying the standby mode and VDD is pulled down to near-zero value. Vdd-stby is always held high. It will be appreciated that, during standby, it could be lowered below its active-mode (full) value, but this issue will not be discussed in any further detail herein.

Figure 6:
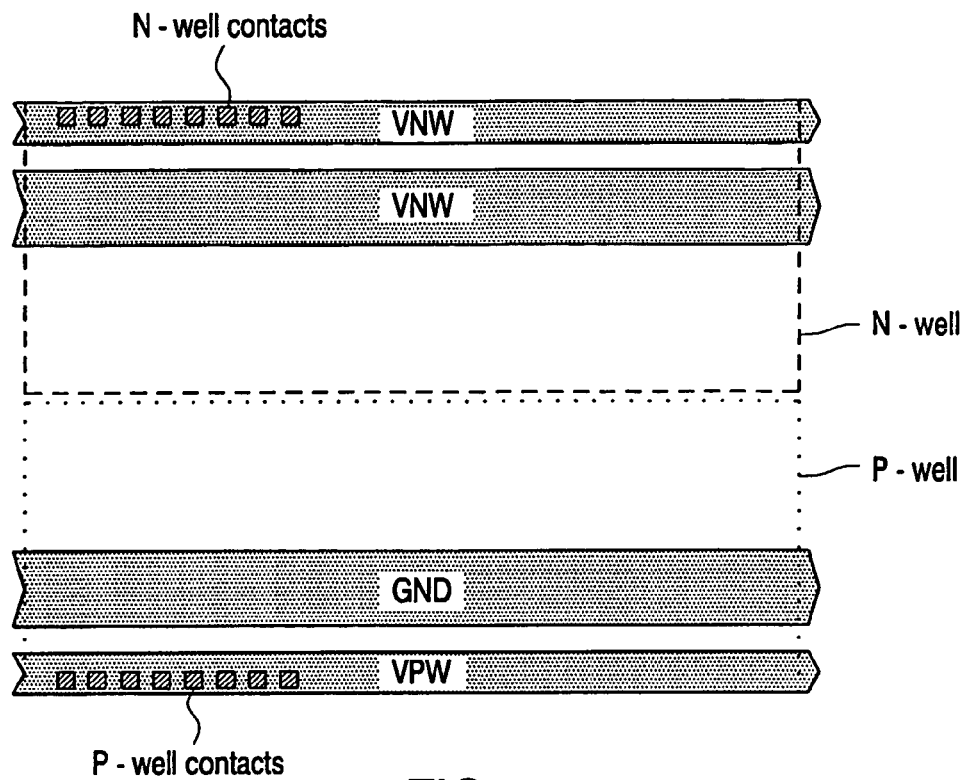
FIG. 6 is a schematic diagram illustrating a suggested layout for standard cells.
Figure 7:
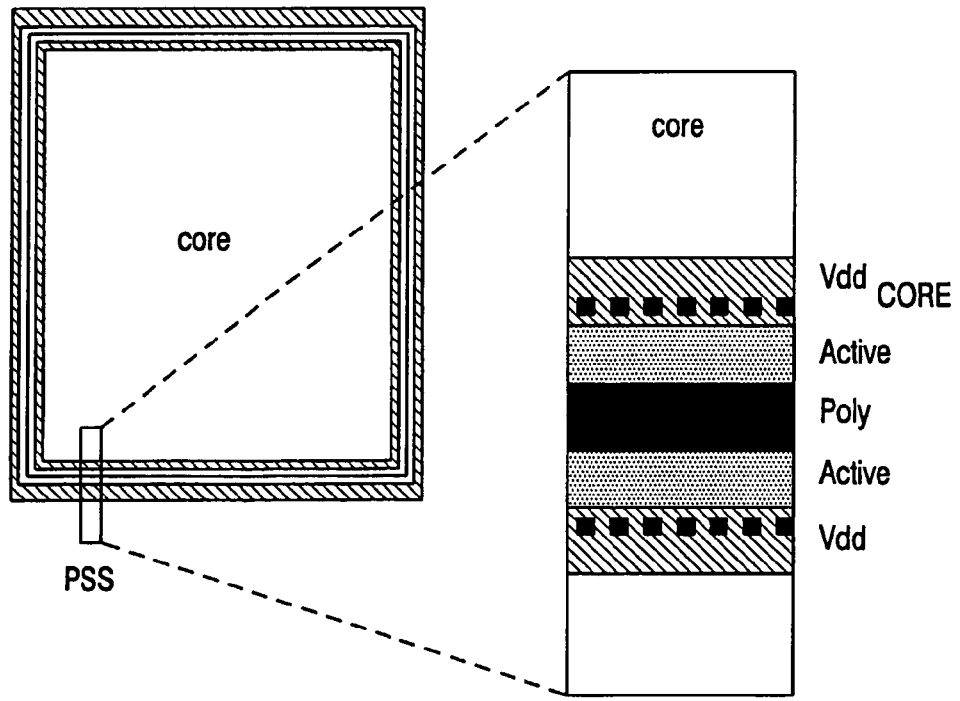
FIG. 7 is a schematic diagram illustrating the concept of wrapping a power supply switch around a transistor core.

Since DSF=s need separate n-well contacts, the conventional layout style of connecting the n-well to VDD will not work. In the case of a triple-well process, library cells may have separate n-well and p-well contacts. A proposed exemplary layout scheme is suggested for standard cells and is illustrated in FIG. 6. Note that there are 4 abutting pins, viz., VDD, GND, VNW (n-well voltage) and VPW (p-well voltage). The power supply switch (PSS) can be easily wrapped around the core as shown in FIG. 7, in most cases. The zoomed inset shows details of the PSS, with VDD on the outside and VDD core on the inside. If the required PSS width is less than the perimeter of the core, it can be segmented. If the required width is larger, it can be folded around the core.

Figure 8:
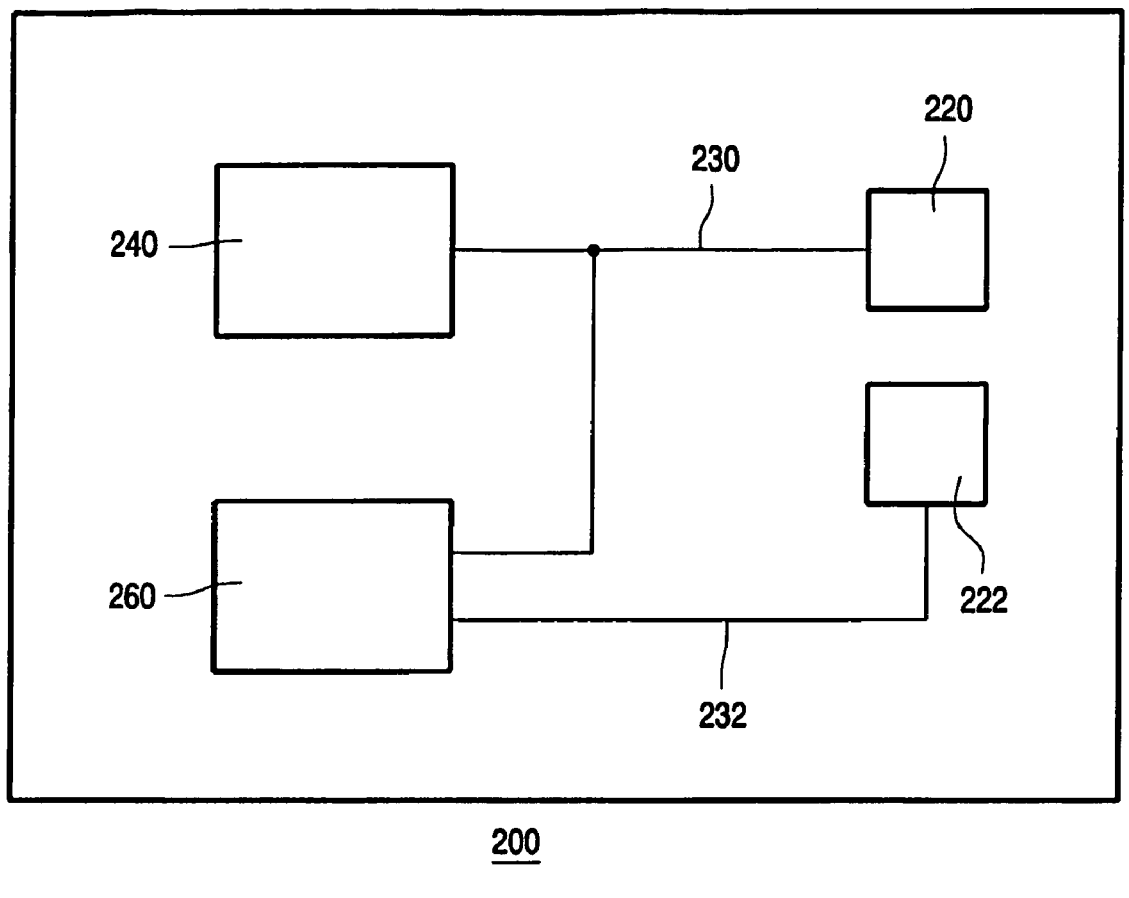
FIG. 8 shows an exemplary electronic device according to the present invention.

The present invention is applicable for all devices, which require low standby leakage and standby state retention. An example of such an electronic device is given in FIG. 8.

Electronic device 200 has a first circuit portion 240 and a second circuit portion 260, the latter being arranged to maintain a state of the first circuit portion 240 at least during a standby mode of the electronic device 200. To this end, at least one state retaining circuit as shown in FIG. 1 and its detailed description, is included in the second circuit portion 260. Obviously, the second circuit portion 260 may include other circuit elements having other tasks as well. The electronic device 200 also includes a regular power supply 220 and a standby power supply 222. The regular power supply 220 is arranged to provide the first circuit portion 240 and the second circuit portion 260 with a power supply via conductor 230 during an active mode of the electronic device 200, whereas the standby power supply 222 is arranged to provide the second circuit portion 260, or at least the circuit elements of the data storage unit 5 of its state retaining circuit, with a standby power supply via conductor 232 during a standby mode of the electronic device 100. In a normal, active mode of the electronic device200,the power supplied by the regular power supply 220 and the standby power supply 222 is of a substantially similar strength. In fact, during the active mode, the standby power supply 222 may be an integral part of regular power supply 220. However, during the standby mode of electronic device 200, the regular power supply 220 is switched off, or the first and second circuit portions 240 and 260 are disconnected from the regular power supply 220, and only the state retaining part of the second circuit portion 160 is connected to the standby power supply 222, which preferably provides a reduced power compared to its power supply of electronic device 200 in order to minimize the power consumption of the state retaining part of the second circuit portion 260.

This is especially advantageous for battery-powered electronic devices, because the power consumption during standby mode is drastically reduced, which increases the lifetime of an operation cycle, i.e., the time period during which no recharging of the battery is required, of the electronic device, e.g., a mobile phone or a laptop computer. This will drastically improve the marketability of the electronic device, because the operation cycle lifetime is one of the most important qualities of such devices.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without exceeding the scope of the invention. The scope of the invention is, of course, defined in the language in which the appended claims are expressed.

The invention claimed is:

1. A method for reducing the power consumption in a state retaining circuit during a standby mode, comprising:
   in an active mode, the state retaining circuit utilizing a regular power supply and a standby power supply;
   for a transition from an active mode to a standby mode for the purpose of reducing power consumption, while maintaining a connection to the regular power supply, decreasing the regular power supply to ground level and maintaining utilization of the standby power supply thus providing circuit elements of the state retaining circuit with enough power for retaining a state during standby mode; and
   for a transition from the standby mode to the active mode, increasing the regular power supply from the ground level to an active level, wherein:
   the state retaining circuit comprises a control unit, a data input unit, a data output unit, and a data storage unit, and each of the control unit, the data input unit, the data output unit, and the data storage unit utilize both the regular power supply and the standby power supply during the active mode.

2. The method of claim 1, wherein the standby power supply is decreased from the active level to a lower level in moving from the active mode to the standby mode, the lower level being sufficient for retaining the state; and the standby power supply is increased from the lower level to the active level in returning back into the active mode.

3. The method of claim 2, wherein the step of decreasing the standby power supply takes place after the regular power supply has settled at the ground level; the method further comprising the step of increasing the regular power supply to the active level after the standby power supply has settled at its active level upon returning back into the active mode.

4. The method of claim 1, wherein a control signal is held during standby mode.

5. The method of claim 4, wherein said control signal is held at a predetermined level during standby mode.

6. The method of claim 4, wherein said control signal is held during standby mode by means external to said state retaining circuit.

7. The method of claim 4, wherein said control signal is held during standby mode by means provided within said state retaining circuit.

8. The method of claim 7, wherein said means for holding said control signal during standby mode comprises at least one transistor having a gate terminal connected to a standby signal, and arranged to be switched to an "ON" position during standby and switched to an "OFF" position otherwise, the drain or source terminal of said transistor being connected to a line having a voltage level at which said control signal is required to be held.

9. The method of claim 8, wherein said voltage level is substantially ground.

10. The method of claim 9, wherein said transistor is an n-channel MOSFET having a gate terminal connected to a standby signal which is set "HIGH" during standby and set "LOW" otherwise, and a source terminal connected to ground.

11. A state retaining circuit, comprising:
   a control unit for providing at least one control signal;
   a data input unit for providing at least one input signal;
   a data output unit for providing at least one output signal;
   a data storage unit for holding at least a part of the state of the circuit during a standby mode;
   first means for coupling a power supply from a regular power supply to the data storage unit during an active mode;
   second means for coupling a power supply from a standby power supply to at least a part of the data storage unit during the active mode and the standby mode;
   wherein each of the control unit, the data input unit, the data output unit, and the data storage unit utilize both the regular power supply and the standby power supply during the active mode.

12. The circuit of claim 11, wherein the control unit is connected to the regular power supply and to the standby power supply for retaining a state of the control signal during the standby mode.

13. The circuit of claim 11, wherein the data input unit is connected to the regular power supply.

14. The circuit of claim 11, wherein the data input unit is connected to the control signal.

15. The circuit of claim 11, wherein the data storage unit is connected to the regular power supply and to the standby power supply.

16. The circuit of claim 11, wherein the data storage unit comprises a serial circuit for retaining an inverted data input signal.

17. The circuit of claim 11, wherein the data output unit comprises at least one input terminal for receiving a signal from the data storage unit, and at least one output terminal for outputting the received signal from the data storage unit.

18. The circuit of claim 11, wherein a selection of circuit elements of the state retaining circuit have a higher threshold voltage than circuit elements not belonging to the selection.

19. The circuit of claim 11, comprising means for holding said control signal at a predetermined level during standby.

20. The circuit of claim 19, wherein said means for holding said control signal is included in said control unit.

21. The circuit of claim 19, wherein said means for holding said control signal is connected to a standby signal which is set "HIGH" during standby mode and set "LOW" otherwise.

22. The circuit of claim 11, including means for providing additional current to the circuit during the active mode, so as to reduce the current requirement from said standby power supply.

23. An electronic device, comprising:
a regular power supply;
a standby power supply;
a first circuit portion coupled to the regular power supply;
a second circuit portion coupled to the regular power supply, the second circuit portion comprising:
a state retaining circuit for retaining at least a part of a state of the first circuit portion during a standby mode of the electronic device, the state retaining circuit comprising:
a control unit for providing at least one control signal;
a data input unit for providing at least one input signal;
a data output unit for providing at least one output signal;
a data storage unit for holding at least a part of the state of the first circuit portion during the standby mode;
the regular power supply being arranged to supply power to the data storage unit during an active mode of the electronic device;
the standby power supply being arranged to supply power to at least a part of the data storage unit during the active mode and the standby mode;
wherein each of the control unit, the data input unit, the data output unit, and the data storage unit utilize the regular power supply and the standby power supply during the active mode of the electronic device.

24. An electronic device as claimed in claim 23, wherein the standby power supply is arranged to provide a reduced power to at least part of the state retaining circuit during the standby mode.

25. An electronic device as claimed in claim 23, wherein a selection of circuit elements of the state retaining circuit are located in a separate well of the second circuit portion.

* * * * *